(12) United States Patent
Satonaka et al.

(10) Patent No.: US 7,582,523 B2
(45) Date of Patent: Sep. 1, 2009

(54) METHOD OF MANUFACTURING SEMICONDUCTOR DEVICE INCLUDING INSULATED-GATE FIELD-EFFECT TRANSISTORS

(75) Inventors: Tomoya Satonaka, Kanagawa-ken (JP); Hideki Oguma, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 39 days.

(21) Appl. No.: 12/018,476

(22) Filed: Jan. 23, 2008

(65) Prior Publication Data

US 2008/0176369 A1    Jul. 24, 2008

(30) Foreign Application Priority Data

Jan. 23, 2007    (JP) .............................. 2007-012699

(51) Int. Cl.
*H01L 21/00* (2006.01)
(52) U.S. Cl. ................... 438/231; 438/424; 438/585
(58) Field of Classification Search ............. 438/424, 438/585, 231
See application file for complete search history.

(56) References Cited

U.S. PATENT DOCUMENTS

| | | | |
|---|---|---|---|
| 6,965,147 B2* | 11/2005 | Shino | 257/347 |
| 7,008,866 B2* | 3/2006 | Huang et al. | 438/585 |
| 2004/0157385 A1* | 8/2004 | Ikezawa | 438/197 |
| 2005/0110078 A1* | 5/2005 | Shino | 257/331 |
| 2007/0037101 A1* | 2/2007 | Morioka | 430/313 |
| 2007/0048987 A1* | 3/2007 | Satonaka | 438/585 |
| 2008/0176369 A1* | 7/2008 | Satonaka et al. | 438/231 |
| 2009/0098705 A1* | 4/2009 | Satonaka | 438/424 |

FOREIGN PATENT DOCUMENTS

JP    2004-266249    9/2004

\* cited by examiner

*Primary Examiner*—Laura M Menz
(74) *Attorney, Agent, or Firm*—Finnegan, Henderson, Farabow, Garrett & Dunner, L.L.P.

(57) ABSTRACT

A method of manufacturing a semiconductor device including MOS transistors is disclosed. N-type and p-type semiconductor films are formed respectively above first and second surface regions of a semiconductor substrate. First and second protective films are laminated on the semiconductor films. The second protective film is selectively etched to form first and second patterned films. Impurities are introduced into one of the first and second patterned films. Then, surface portions of the first and second patterned films are oxidized, and the formed oxide films are etched. The first protective film is etched using the first and second patterned films as a mask. The n-type and p-type semiconductor films are etched using the remaining first protective film as a mask to form first and second gate electrodes.

20 Claims, 6 Drawing Sheets

METHOD OF MANUFACTURING SEMICONDUCTOR DEVICE INCLUDING INSULATED-GATE FIELD-EFFECT TRANSISTORS

CROSS REFERENCE TO RELATED APPLICATION

The application is based upon and claims the benefit of priority from the prior Japanese Patent Application No. 2007-12699, filed on Jan. 23, 2007, the entire contents of which are incorporated herein by reference.

FIELD OF THE INVENTION

The present invention relates to a method of manufacturing a semiconductor device including n-type and p-type insulated-gate field-effect transistors.

DESCRIPTION OF THE BACKGROUND

The development of semiconductor devices is advancing towards higher integration. The higher integration requires miniaturization of an insulated-gate field-effect transistor (hereinafter referred to as "MOS transistor") in order to suppress increase of chip size.

A CMOS-type semiconductor device of a dual-gate structure is employed to suppress short-channel effects being caused by miniaturization of MOS transistors so as to obtain a threshold-voltage level comparable to that of conventional-type MOS transistors. The dual-gate-structure CMOS-type semiconductor device includes a p-channel-type MOS transistor (hereinafter referred to as "p-MOS transistor"). The p-MOS transistor is provided with a gate electrode of poly-silicon containing high concentration p-type impurities. Such a gate electrode is called as "$p^+$ poly-silicon gate electrode".

The dual-gate-structure CMOS-type semiconductor device further includes an n-channel-type MOS transistor (hereinafter, referred to as "n-MOS transistor"). The n-MOS transistor is provided with a gate electrode of a poly-silicon containing high concentration n-type impurities. Such a gate electrode is called as "$n^+$ poly-silicon gate" electrode. These two types of MOS transistors are formed in a common semiconductor substrate.

In manufacturing the $p^+$ and $n^+$ poly-silicon gate electrodes, a poly-silicon film is selective etched, after high-concentration p-type and n-type impurities are doped into the respective poly-silicon areas of the poly-silicon film.

The etching is usually carried out by a reactive ion etching (RIE) method. The poly-silicon areas, which have different conductivity types, are etched at different rates by the RIE method. The difference in the etching rate causes a problem that the gate electrode of the p-MOS transistor differs in dimensions and shape from that of the n-MOS transistor.

Such a difference in dimensions and shape causes unevenness of characteristics between the p-MOS transistor and the n-MOS transistor. Accordingly, the dual-gate-structure CMOS-type semiconductor device is difficult to have constant characteristics. The, in turn, results in difficulty in miniaturization of the CMOS-type semiconductor device.

Japanese Patent Application Publication (Kokai) No. 2004-266249, for example, discloses a method of reducing the difference in dimensions and shape between the p-type and n-type gate electrodes. Such reduction is implemented by changing etching condition between low and high impurity-concentration regions of a poly-silicon film, which has been doped with p-type and n-type impurities.

The low impurity concentration region is a lower portion of the poly-silicon film. The high impurity concentration region is an upper portion of the poly-silicon film. Different etching conditions are respectively applied to the lower and upper portions.

The lower and low impurity concentration portion is etched under a first etching condition using an etching gas containing a halogen/oxygen-based gas.

Further, the upper and the high impurity concentration is etched under a second etching condition using an etching gas containing CF-based gas. Under the second etching condition, side etching is less likely to occur than under the first conditions.

With these measures, the difference is reduced in shape between the p-type and n-type gate electrodes.

Nevertheless, there still remains a problem that the p-type and n-type gate electrodes formed are different from each other in size. Thus, the gate electrodes do not always show desirable shape and dimensions.

SUMMARY OF THE INVENTION

According to a first aspect of the present invention, a method of manufacturing a semiconductor device including insulated-gate field-effect transistors is provided which comprises forming first and second insulating films on first and second surface regions of a semiconductor substrate respectively, forming an n-type semiconductor film on the first insulating film and forming a p-type semiconductor film on the second insulating film, forming a first protective film on the n-type and the p-type semiconductor films, forming a second protective film of a material on the first protective film, the material being different from that of the first protective film, removing the second protective film partially to form first and second patterned films respectively above the first and the second surface regions, introducing impurities into the second patterned film, oxidizing the first patterned film and the second patterned film containing the introduced impurities to form an oxide film, etching the oxide film selectively to slim the second patterned film thinner than the first patterned film, etching the first protective film using the first and the second patterned films as a mask to form third and fourth patterned films, after the slimming, etching the n-type and the p-type semiconductor films using the third and fourth patterned films as a mask to form first and second gate electrodes respectively, implanting n-type impurities into the first surface region using the first gate electrode as a mask and implanting p-type impurities into the second surface region using the second gate electrode as a mask, in order to form source regions and drain regions in the first and the second surface regions respectively.

According to another aspect of the present invention, a method of manufacturing a semiconductor device including insulated-gate field-effect transistors is provided which comprises forming first and second insulating films on first and second surface regions of a semiconductor substrate respectively, forming an n-type semiconductor film on the first insulating film and forming a p-type semiconductor film on the second insulating film, forming a first protective film on the n-type and the p-type semiconductor films, forming a second protective film of a material on the first protective film, the material being different from that of the first protective film, removing the second protective film partially to form first and second patterned films respectively above the first and the second surface regions, introducing impurities into the first patterned film, etching the first and the second patterned films isotropically to slim the second patterned film thinner than the impurity-introduced first patterned film, etching the first protective film using the first and the second patterned films as a mask to form third and fourth patterned films, after the slimming, etching the n-type and the p-type semiconductor films using the third and fourth patterned films as a mask to form first and second gate electrodes respectively, implanting n-type impurities into the first surface region using the first gate electrode as a mask and implanting p-type impurities into the second surface region using the second gate electrode as a mask, in order to form source regions and drain regions in the first and the second surface regions respectively.

DETAILED DESCRIPTION OF THE INVENTION

Hereinafter, embodiments of the invention will be described with reference to accompanying drawings.

A method of manufacturing a semiconductor device according to a first embodiment of the present invention will be described with reference to FIGS. 1A to 1L. FIGS. 1A to 1L are sectional views showing steps of manufacturing the semiconductor device according to the first embodiment. Especially, FIGS. 1B to 1K show states of the main portion of the section of FIG. 1A in the respective steps.

Figure 1A:
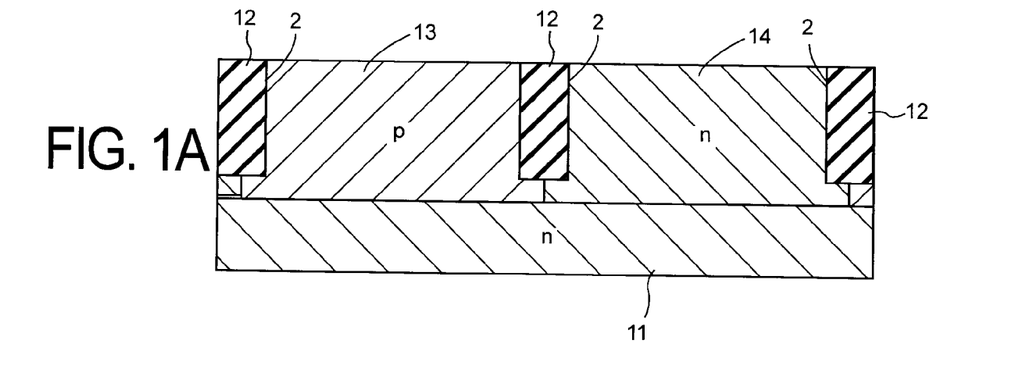
FIGS. 1A to 1L are sectional views showing steps of manufacturing a semiconductor device including insulated-gate field-effect transistors according to a first embodiment of the invention.

As shown in FIG. 1A, trenches 2 are formed in a semiconductor substrate, for example, in an n-type silicon substrate 11. Subsequently, insulating layers 12 are buried in the trenches 2 to form well regions isolated from one another electrically. Such isolation is called as "Shallow Trench Isolation (STI)".

Then, p-type and n-type impurities are implanted into the well regions respectively to form a p-type well region 13 as a first surface region and an n-type well region 14 as a second surface region.

An n-MOS transistor and a p-MOS transistor are to be formed respectively in the p-type well region 13 and in the n-type well region 14. These transistors are formed according to the steps to be described below.

Figure 1B:
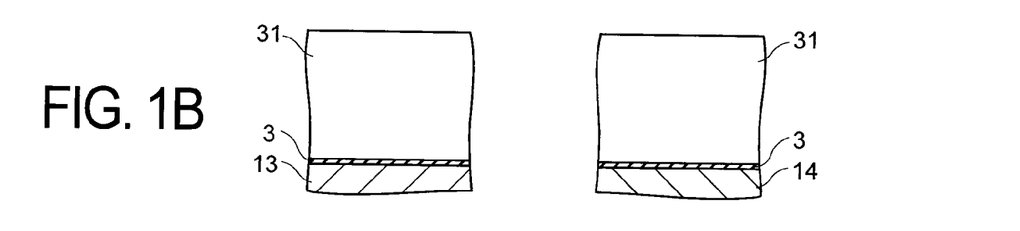

As shown in FIG. 1B, a silicon oxide film 3 of an approximately 1.5 nm thickness is formed on the n-type silicon substrate 11 as an insulating film, by a thermal oxidation method, for example. The silicon oxide film 3 is to be a gate insulating film.

On the silicon oxide film 3, an un-doped poly-silicon film 31 of an approximately 130 nm thickness is formed by a chemical vapor deposition (CVD) method, for example. The un-doped poly-silicon film 31 is to be a gate electrode film.

Figure 1C:
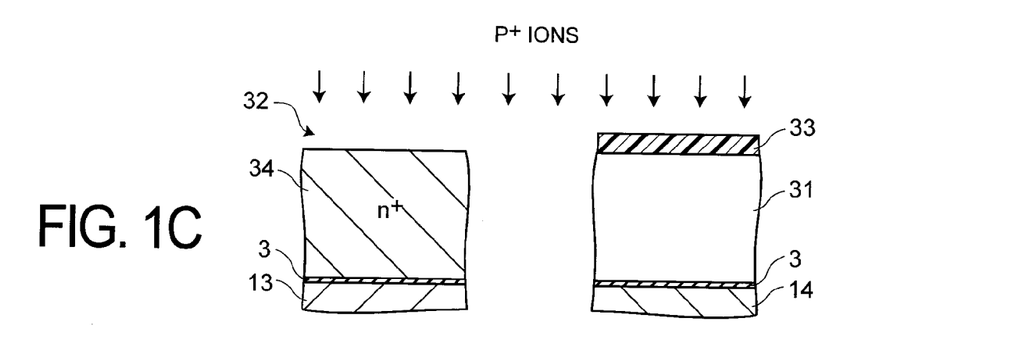

Subsequently, as shown in FIG. 1C, a resist film 33 is formed on the un-doped poly-silicon film 31 by a photolithography method. An opening 32 is formed in the resist film 33 at a position above the p-type well region 13.

By using the resist film 33 as a mask, phosphorus ions (P$^+$) are implanted into the un-doped poly-silicon film 31 with an acceleration voltage of 1 keV and with a dose amount of approximately 1E15 cm$^{-2}$, for example.

Accordingly, a part of the un-doped poly-silicon film 31 above the p-type well region 13 becomes an n$^+$-type poly-silicon film 34. The n$^+$-type poly-silicon film 34 has an impurity-concentration profile corresponding to the implantation profile of the phosphorus ions.

Figure 1D:
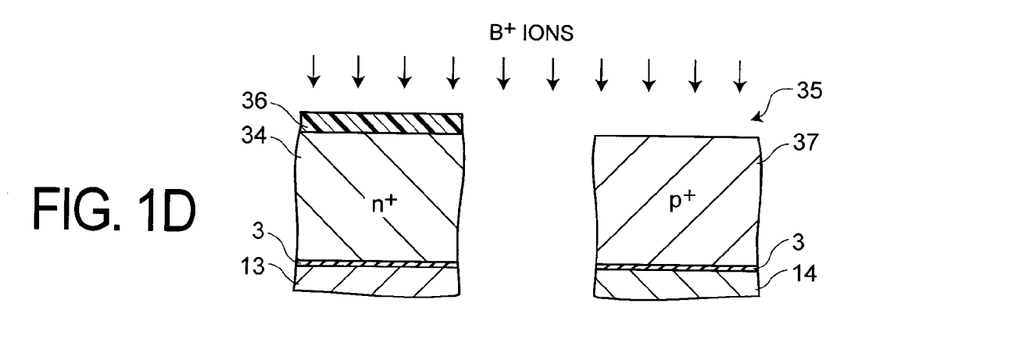

Subsequently, as shown in FIG. 1D, a photo-resist film 36 is formed on the n$^+$-type poly-silicon film 34 by a photolithography method. An opening 35 is formed in the photo-resist film 36 at a position above the n-type well region 14.

By using the photo-resist film 36 as a mask, boron ions (B$^+$) are implanted into the un-doped poly-silicon film 31 with an acceleration voltage of 3 keV and with a dose amount of approximately 4E15 cm$^{-2}$, for example.

Accordingly, a part of the un-doped poly-silicon film 31 above the n-type well region 14 becomes an p$^+$-type poly-silicon film 37. The p$^+$-type poly-silicon film 37 has an impurity-concentration profile corresponding to the implantation profile of boron ions.

Figure 1E:
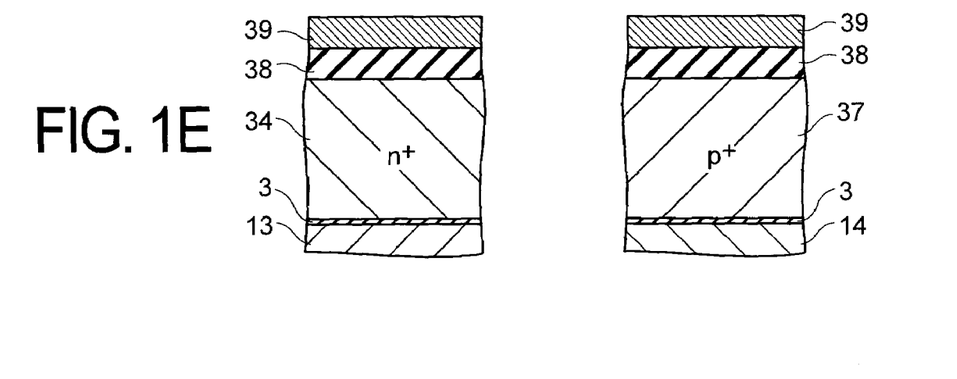

Subsequently, as shown in FIG. 1E, a first protective film, for example, a silicon nitride film 38 of an approximately 60 nm thickness, is formed on the gate electrode films 34 and 37 respectively above the first and the second regions 13 and 14.

Subsequently, a second protective film, for example, an amorphous silicon film 39 of an approximately 40 nm thickness, is formed on the silicon nitride film 38.

Subsequently, on the amorphous silicon film 39, an anti-reflective film (not illustrated) is formed, and then a resist film is formed on the anti-reflective film. The resist film is selectively exposed and removed by a photolithography method. The selective exposure is carried out by a projection exposure method using ArF excimer laser, for example.

Figure 1F:
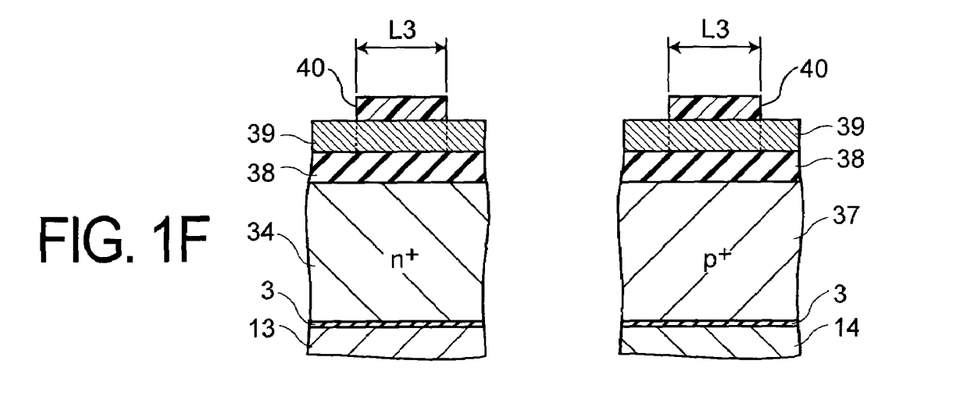

As a result, resist patterns 40 are formed as shown in FIG. 1F. Each of the resist patterns 40 has a size larger than the size of each of the gate electrodes. The size of the resist patterns 40 (L3) is larger than a gate length (L1) of an n-MOS transistor and a gate length (L2) of a p-MOS transistor respectively to be completed later. For example, L3 is approximately 42 nm while each of L1 and L2 is approximately 30 nm. In addition, the thickness of each of the resist patterns 40 is approximately 280 nm.

More specifically, in the above step of FIG. 1F, resist patterns of a 60 nm to 80 nm width are formed by the photolithography method. Then, the formed resist patterns are slimmed so as to form resist patterns 40 of an approximately 42 nm size through a process of removing the anti-reflective film (to be described below). The removal of the anti-reflective film is performed by a plasma etching using an oxygen-based gas.

Figure 1G:
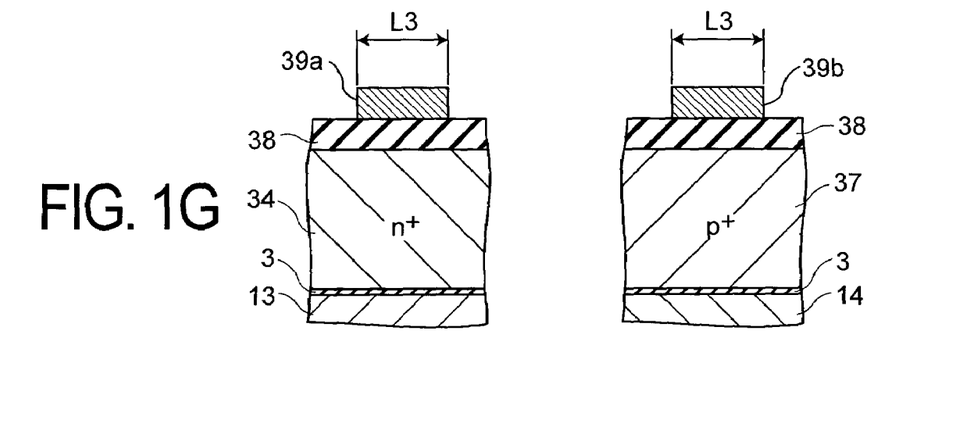

As shown in FIG. 1G, by using the resist patterns as a mask, the anti-reflective film and the amorphous silicon film 39 are etched and removed. The etching of the amorphous silicon film 39 is carried out by using an inductively-coupled-plasma-type reactive-ion-etching apparatus (ICP-type RIE apparatus) under the following detailed conditions.

The etching of the anti-reflective film is carried out, for example, with a 10 mT pressure. Each of the flowing rates of CF$_4$ and O$_2$ is 50 sccm. The source power to be applied to the upper electrode is 350 W while the bias power applied to the lower electrode is 30 W.

The etching of the amorphous silicon film 39 is carried out, for example, with a 6 mT pressure. The flowing rates of HBr, CF$_4$, and Cl$_2$ are 50 sccm, 120 sccm, and 10 sccm, respectively. The source power to be applied to the upper electrode is 600 W, while the bias power to be applied to the lower electrode is 150 W.

Then, a residue of the amorphous silicon film 39 is removed under the conditions of a 90 mT pressure, a HBr flowing rate of 150 sccm, a $O_2$ flowing rate of 4 sccm, a source power to be applied to the upper electrode of 800 W and a bias power to be applied to the lower electrode of 100 W respectively, for example.

After that, the resist patterns 40 are rendered to be ash and removed using an asher. Then, adhered material is removed with a mixed liquid of sulfuric acid and hydrogen peroxide (SH mixture).

Consequently, amorphous silicon films 39a and 39b are formed as first and second patterned films, respectively. The amorphous silicon films 39a, 39b have a size L3 larger than the sizes L1, L2 of the corresponding gate electrodes to be formed later.

Figure 1H:
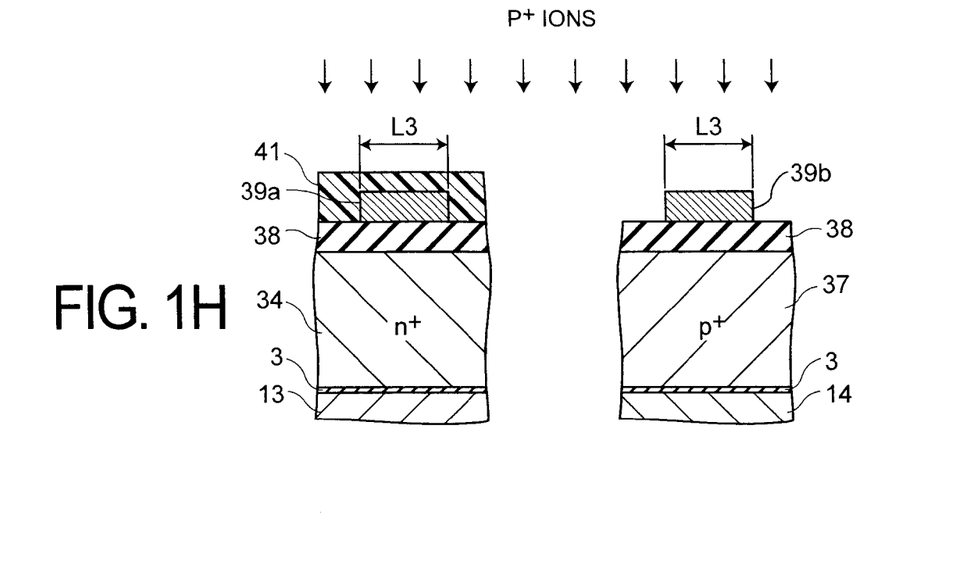

As shown in FIG. 1H, the p-type well region 13 is covered with a resist film 41. Phosphorus ions ($P^+$) are implanted into the n-type well region 14 with an acceleration voltage of 1 keV and with a dose amount of approximately 1E15 $cm^{-2}$.

The resist film 41 is rendered to be ash and removed using an asher. Adhered material is removed with a mixed liquid of sulfuric acid and hydrogen peroxide (SH mixture).

By the step of FIG. 1H, phosphorus (P) is doped into the amorphous silicon film 39b located above the n-type well region 14.

Figure 1I:
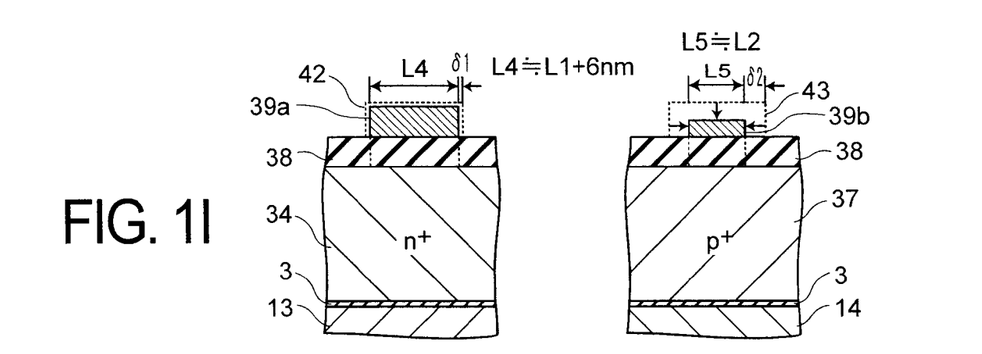

As shown in FIG. 1I, the amorphous silicon films 39a and 39b are thermally oxidized, for example, at 650° C. for approximately 70 sec. The amorphous silicon film 39b doped with phosphorus (P) has a higher thermal-oxidation rate than that of the un-doped amorphous silicon film 39a.

A first oxide film 42 is formed with a smaller thickness of 0.75 nm on the surface of the amorphous silicon film 39a. On the other hand, a second oxide film 43 is formed with a larger thickness of 1.5 nm on the surface of the amorphous silicon film 39b. It is because the amorphous silicon film 39b contains phosphorus (P) and has a larger thermal-oxidation rate than the amorphous silicon film 39a.

The first and the second oxide films 42 and 43 are wet-etched selectively with an etching liquid containing hydrofluoric acid. Consequently, the amorphous silicon film 39a and the amorphous silicon film 39b1 are slimmed by 1.5 nm and 3 nm, respectively.

By carrying out repeatedly the thermal oxidation and the etching process four times in total, the pattern size L4 of the amorphous silicon film 39a becomes approximately 36 nm. The pattern size L4 is larger, by 6 nm, than the size of the gate electrode L1 (=30 nm) to be formed later.

On the other hand, the pattern size L5 of the amorphous silicon film 39b becomes equal to approximately 30 nm. The pattern size L5 is substantially equal to the size L2 (=30 nm) of the gate electrode to be formed later. Since the pattern size L5 of the amorphous silicon film 39b is substantially equal to the size L2 of the gate electrode, a gate electrode can be obtained with the size L2 through an anisotropic etching process (to be described later) of the $p^+$ silicon film 37.

In FIG. 1I, δ1 represents the total thickness of the first oxide film 42, while δ2 represents the total thickness of the second oxide film 43.

Figure 1J:
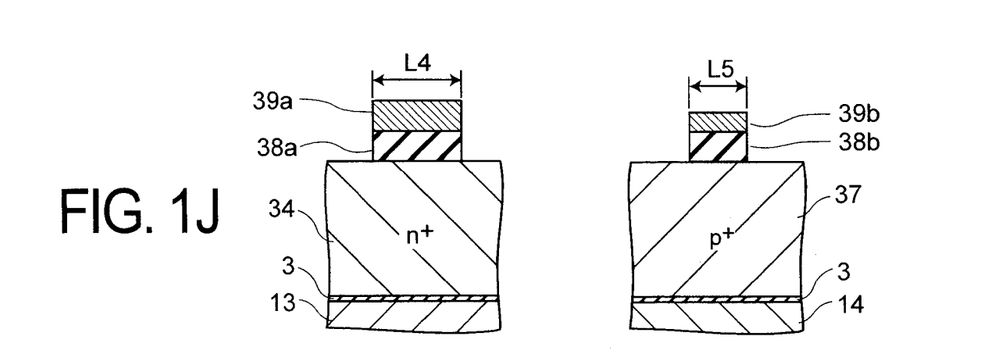

As shown in FIG. 1J, by using the amorphous silicon films 39a and 39b as a mask, the silicon nitride film 38 is etched. The etching is carried out by using an ICP-type RIE apparatus. As a result, nitride films 38a and 38b are formed as third and fourth patterned films.

The etching of the silicon nitride film 38 is carried out, for example, with a pressure of 20 mT. The flowing rates of $CH_3F$, $O_2$ and He are 80 sccm, 30 sccm, and 100 sccm, respectively. The source power to be applied to the upper electrode is 400 W, while the bias power to be applied to the lower electrode is 200 W.

Figure 1K:
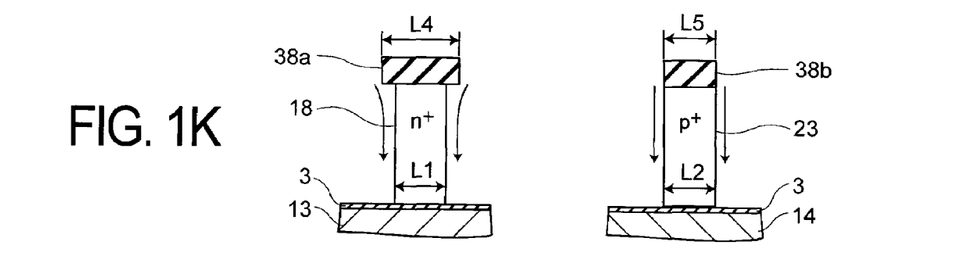

As shown in FIG. 1K, by using the silicon nitride films 38a and 38b as a mask, the $n^+$-type poly-silicon film 34 and the $p^+$-type poly-silicon film 37 are respectively etched. The etching is carried out using an ICP-type RIE apparatus.

The etching of the upper portion of each of the $n^+$-type poly-silicon film 34 and the $p^+$-type poly-silicon film 37 is carried out, for example, with a pressure of 6 mT. The flowing rates of HBr, $CF_4$, and $Cl_2$ are 150 sccm, 20 sccm, and 10 sccm, respectively. The source power to be applied to the upper electrode is 600 W, while the bias power to be applied to the lower electrode is 150 W.

Etching of the lower portion of each of the $n^+$-type poly-silicon film 34 and the $p^+$-type poly-silicon film 37 is carried out, for example, with a pressure of 15 mT. The flowing rates of HBr and $O_2$ are 150 sccm and 4 sccm, respectively. The source power to be applied to the upper electrode is 500 W, while the bias power to be applied to the lower electrode is 45 W.

Subsequently, a residue of the $n^+$-type poly-silicon film 34 and the $p^+$-type poly-silicon film 37 is removed under the conditions of a pressure of 90 mT, a HBr flowing rate of 150 sccm, an $O_2$ flowing rate of 4 sccm, for example. The source power to be applied to the upper electrode is 800 W, and the bias power to be applied to the lower electrode is 100 W.

With these steps, the $n^+$-type poly-silicon film 34 is etched with side-etching while keeping a vertical shape. Consequently, a gate electrode 18 of the $n^+$-type poly-silicon film is obtained with the predetermined gate length L1 as a first gate electrode On the other hand, the $p^+$-type poly-silicon film 37 is etched without side-etching substantially while keeping a vertical shape. Consequently, a gate electrode 23 of the $p^+$-type poly-silicon film is obtained with the predetermined gate length L2 as a second gate electrode.

The $n^+$-type poly-silicon film 34 has an etching rate larger than that of the $p^+$-type poly-silicon film 37. Though there is a difference in etching rate between the $n^+$-type poly-silicon film 34 and the $p^+$-type poly-silicon film 37, it is prevented to produce a difference in shape between the gate electrodes 18, 23. The gate electrodes 18 and 23 can be obtained with a uniform shape.

Figure 2:
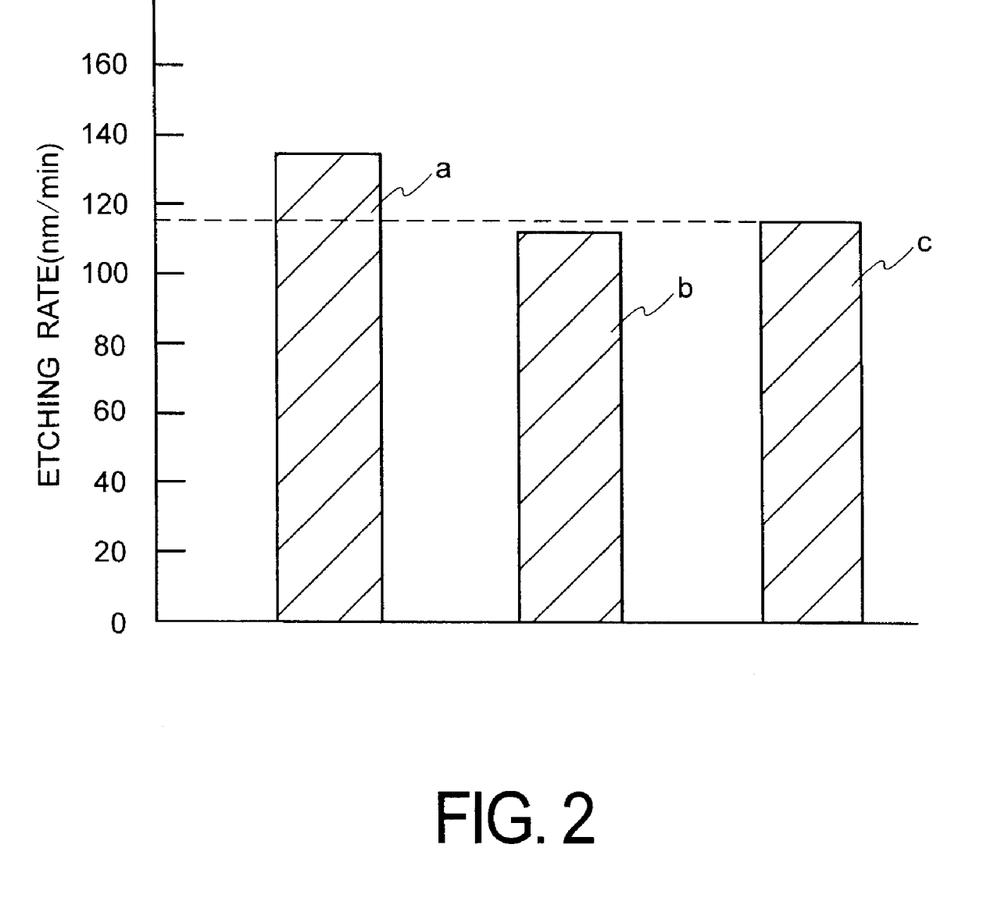
FIG. 2 shows examples of etching rates of poly-silicon films.

FIG. 2 shows experimental examples of the etching rates of poly-silicon films doped with high-concentration phosphorus or boron. In the experiments, an ICP-type RIE apparatus was employed. An $HBr/Cl_2$-based gas was used for the RIE. In FIG. 2, the etching rate a represents that of a poly-silicon film doped with high-concentration phosphorus. The implantation of phosphorus was carried out with an acceleration voltage of 5 keV and with a dose amount of approximately 5E15 $cm^{-2}$. In FIG. 2, the etching rate b represents that of a poly-silicon film doped with high-concentration boron. The implantation of boron was carried out with an acceleration voltage of 1 keV and with a dose amount of approximately 2E15 $cm^{-2}$. In FIG. 2, the etching rate c represents that of an un-doped poly-silicon film which is provided as a comparative example.

As shown in FIG. 2, the etching rate a of the poly-silicon film doped with high-concentration phosphorus was approximately 1.2 times larger than the etching rate b of the poly-silicon film doped with high-concentration boron.

In addition, the etching rate a of the poly-silicon film doped with high-concentration phosphorus was larger than the etching rate c of the un-doped poly-silicon film. The etching rate h of the poly-silicon film doped with high-concentration boron was smaller than the etching rate c of the un-doped poly-silicon film.

Moreover, the outcome of the experiments indicates that the etching rate of the poly-silicon film containing phosphorus was accelerated after the concentration of the phosphorus exceeded $1E18\ cm^{-3}$ in the poly-silicon film.

A region, which extends from the surface of the $n^+$-type poly-silicon film 34 to the depth where the impurity concentration does not fall down below approximately $1E18\ cm^{-3}$, may be defined as an upper region, while the remaining region below the upper region may be defined as a lower region. As described above, an appropriate etching shape may be obtained by changing etching conditions for upper and lower regions.

For example, when phosphorus is implanted into the un-doped poly-silicon film 31 with an acceleration voltage of 5 keV and with a dose amount of approximately $5E15\ cm^{-2}$, an implantation profile may be obtained with a peak impurity concentration not beyond the level of $E21\ cm^3$ and with an approximately 30-nm depth where the impurity concentration falls down to $1E18\ cm^{-3}$. The region, which extends from the surface to the depth of approximately 30 nm, may be defined as the upper region, while the region extends from the approximately 30-nm depth downwards may be defined as the lower area.

In FIG. 1K, the size of the gate electrode 18 of $n^+$-type poly-silicon and the size of the gate electrode 23 of $p^+$-type poly-silicon are represented by the gate lengths L1 and L2 respectively. The gate lengths L1 and L2 are approximately 30 nm. In addition, the gate height of the gate electrodes 18 and 23 are approximately 130 nm. As a result, the gate electrodes 18 and 23 are formed in the same shape substantially.

Figure 1L:
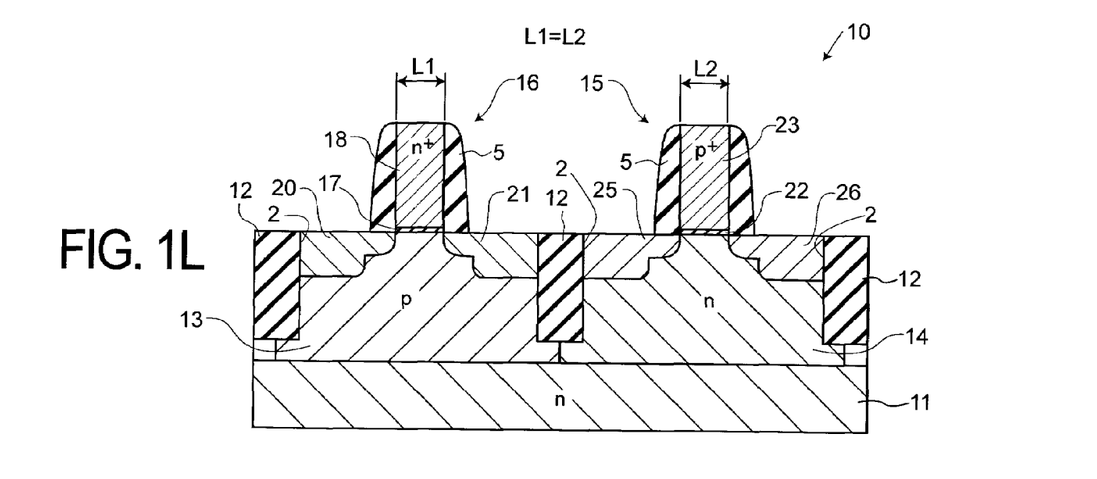

Then, as shown in FIG. 1L, the silicon oxide film 3 is etched and removed except the portions located under the gate electrodes 18 and 23. By the removal process, gate electrode films 17 and 22 are formed. After the nitride film 38a and 38b are removed, N-type ions and p-type ions are implanted into the p-type well region 13 and the n-type well region 14 shallowly using the gate electrodes 18 and 23 as a mask. Sidewalls of the gate electrodes 18 and 23 are coated with insulating films 5.

Further, n-type ions and p-type ions are implanted into the p-type well region 13 and the n-type well region 14, deeply. A heat treatment is carried out to form a source region 20 and a drain region 21 on the respective sides of the gate electrode 18, and to form a source region 25 and a drain region 26 on the respective sides of the gate electrode 23. By the above described steps, a p-MOS transistor 15 and an n-MOS transistor 16 are formed.

A nickel (Ni) film (not illustrated) is formed on the gate electrodes 18 and 23, the source regions 20 and 25, and the drain regions 21 and 26 by a sputtering method, for example. The nickel film thus formed is then subjected to a heat treatment to form a Ni silicide layer.

In the way, a CMOS-type semiconductor device 10 including the p-MOS transistor 15 and the n-MOS transistor 16 is obtained.

In the embodiment, the silicon nitride film 38a is formed above the $n^+$-type poly-silicon film 34 having a larger etching rate in a pattern size L4 larger than the corresponding gate length L1. On the other hand, the silicon nitride film 38b is formed above the $p^+$-type poly-silicon film 37 of a smaller etching rate in a pattern size L5 substantially equal to the corresponding gate length L2.

As a result, the $n^+$-type poly-silicon film 34 is side-etched, and thus the gate electrode 18 is obtained with a gate length L1 that is smaller than the corresponding pattern size L4. On the other hand, the $p^+$-type poly-silicon film 37 is not side-etched much, and thus the gate electrode 23 is obtained with a gate length L2 that is substantially equal to the corresponding pattern size L5.

According to the embodiment, a miniaturized CMOS-type semiconductor device 10 including the p-MOS transistor 15 and the n-MOS transistor 16 may be manufactured stably to have less difference in the shapes of their respective gate electrodes 18, 23. The p-MOS transistor 15 and the n-MOS transistor 16 are substantially uniform in their characteristics. In addition, the chip size can be made smaller by miniaturization, and thus the CMOS-type semiconductor device 10 may be made more highly integrated.

In the embodiment, the $n^+$-type poly-silicon film 34 and the $p^+$-type poly-silicon film 37 are formed respectively by implanting ions of n-type and p-type impurities into the un-doped poly-silicon film 31. Alternatively, $n^+$-type poly-silicon film and $p^+$-type poly-silicon film can be formed by forming poly-silicon films doped with n-type impurities and p-type impurities above the respective well regions 13 and 14, and then by patterning the formed doped poly-silicon films.

In the embodiment, poly-silicon films are used as the $n^+$-type poly-silicon film 34 and the $p^+$-type poly-silicon film 37. Other semiconductor films, for example, poly-silicon-germanium compound films (SiGe films) may be used in place of the $n^+$-type poly-silicon film 34 and the $p^+$-type poly-silicon film 37. Such poly-silicon-germanium compound films can be formed on the silicon oxide film 3 by a CVD method using a $SiH_4$ gas and a $GeH_4$ gas, for example. Poly-silicon-germanium compound films containing approximately 20 atm % Ge may be used.

Such a silicon-germanium compound has a carrier mobility larger than that of poly-silicon. The use of silicon-germanium compound has the following advantages. The use of the silicon-germanium compound may reduce gate resistance. Consequently, the gate electrode can be easily prevented from being a depletion state so that the characteristics of the p-MOS transistor and the n-MOS transistor are improved.

Further, SiGeC films may be used in place of the $n^+$-type poly-silicon film 34 and the $p^+$-type poly-silicon film 37.

In the embodiment described above, phosphorus is implanted into the amorphous silicon film 39b. The phosphorus may be replaced by impurities of different kinds.

Further, in the embodiment, the silicon nitride film 38 is used as the first protective film, and the amorphous silicon film 39 is used as the second protective film.

The silicon nitride film 38 may be replaced by a film such as a TEOS (tetra-ethylorthosilicate) film, which is more difficult to be etched than amorphous silicon. The amorphous silicon film 39 may be replaced by a film composed of an insulating material. The insulating material should have different oxidation rates which are given by doping impurities and non-doping to the insulating material.

A method of manufacturing a semiconductor device including insulated-gate field-effect transistors will be described below according to a second embodiment of the invention.

Figure 3A:
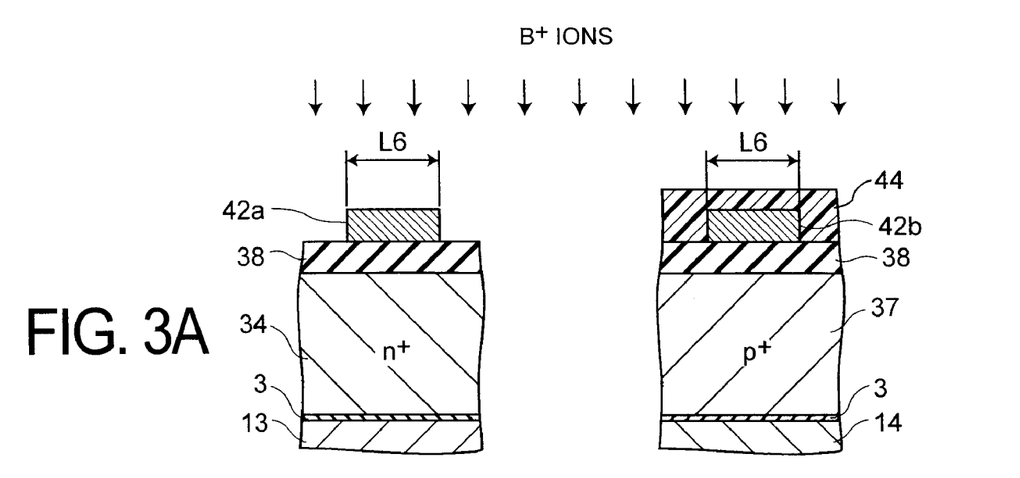
FIGS. 3A and 3B are sectional views showing steps of manufacturing a semiconductor device including insulated-gate field-effect transistors according to a second embodiment of the invention.
Figure 3B:
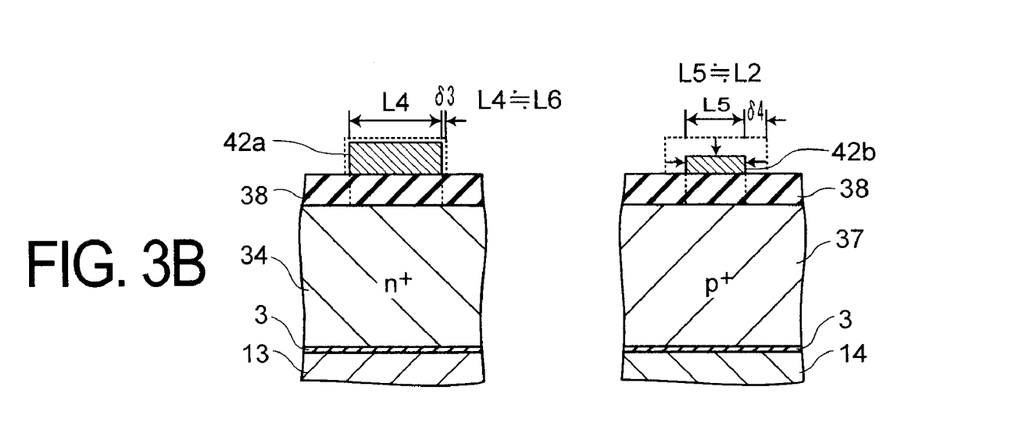

FIGS. 3A and 3B are sectional views showing principal steps according to the second embodiment. The same reference numerals are given to the same components with respect to the first and the second embodiments.

In the second embodiment, boron ions are selectively implanted into an amorphous silicon film 39 located above the p-type well region 13.

The second embodiment will be described in detail below. The same steps of FIGS. 1A to 1E as those in the first embodiment are carried out. Then, as shown in FIG. 1F, an amorphous silicon film 39 serving as a first protective film is etched using resist patterns 40 as a mask. The width of each of the resist patterns 40 is now defined as L6 instead of L3 used in the first embodiment. After the etching, the resist patterns 40 are removed.

Consequently, amorphous silicon films 42a and 42b shown in FIG. 3A are formed. Then, a resist film 44 is coated to cover the portion located above the n-type well region 14. Using the resist film 44 as a mask, boron ions ($B^+$) are implanted with an acceleration voltage of 1 keV and with a dose amount of approximately $5E15$ $cm^{-2}$.

Boron (B) is implanted into the amorphous silicon film 42a located above the p-type well region 13. The resist film 44 is rendered to be ash using an asher. The adhered material is removed using a mixed liquid of sulfuric acid and hydrogen peroxide (SH mixture).

Here, the pattern size L6 of each of the amorphous silicon films 42a and 42b is set at approximately 36 nm.

Subsequently, as shown in FIG. 3B, the amorphous silicon films 42a and 42b are wet-etched isotropically with an etching liquid such as an aqueous solution containing trimethyl-2-hydroxyethyl ammonium hydroxide. By the process, as shown in FIG. 3B, the boron-un-doped amorphous silicon film 42b is etched prior.

An experiment of etching the amorphous silicon films 42a and 42b was carried out by using an aqueous solution containing 0.05-wt % trimethyl-2-hydroxyethyl ammonium hydroxide as the etching liquid. The following etching rates were obtained as the outcome of the experiment.

The etching rate for the amorphous silicon film 42b without any doped boron was approximately 6 nm/min. On the other hand, the etching rate for the amorphous silicon film 42a doped with boron was approximately 0.03 nm/min. In total, the etching rate for the amorphous silicon film 42b was approximately two-hundred times larger than the etching rate for the amorphous silicon film 42a.

For the reason, when the amorphous silicon films 42a and 42b are etched for approximately 30 seconds, the etching amount δ3 for the amorphous silicon film 42a doped with boron is less than 0.015 nm. Consequently, even after the etching, the pattern may substantially maintain its size before the etching.

On the other hand, the etching amount δ4 for the amorphous silicon film 42b becomes as large as 3 nm. As a result, the pattern size L5 after the etching is slimmed from the pattern size L6 before the etching by approximately 6 nm, and is made substantially equivalent to the gate length L2 of the gate electrode 23 shown in FIG. 1L.

After that, in a step similar to that shown in FIG. 1J, the silicon nitride film 38, which serves as a first protective film, is etched by using the amorphous silicon films 42a and 42b as a mask. The etching is carried out by using an ICP-type RIE apparatus to form silicon nitride films 38a and 38b are formed.

Subsequently, as shown in FIG. 1K, the $n^+$-type poly-silicon film 34 and the $p^+$-type poly-silicon film 37 are etched using the silicon nitride films 38a and 38b as a mask. The etching is carried out using an ICP-type RIE apparatus.

With these processes, the $p^+$-type poly-silicon film 37, which has a smaller etching rate, is etched without side-etching substantially while keeping a vertical shape. Consequently, a $p^+$-type gate electrode 23 is obtained with a predetermined gate length L2.

On the other hand, the $n^+$-type poly-silicon film 34, which has a larger etching rate, is etched with side-etching while keeping a vertical shape. An $n^+$-type gate electrode 18 is obtained with a predetermined gate length L1.

Accordingly, the difference in the etching rate between the $n^+$-type poly-silicon film 34 and the $p^+$-type poly-silicon film 37 is prevented from resulting in the difference in shape between the gate electrodes thus obtained. The gate electrodes 18 and 23 can be obtained in the same shape. By carrying out subsequent steps similar to those described with respect to FIG. 1L, a CMOS-type semiconductor device 10 can be obtained.

In the embodiment, boron (B) is doped into the amorphous silicon film 42a located above the p-type well region 13. Accordingly, the etching rate for the amorphous silicon film 42a becomes smaller than the etching rate for the amorphous silicon film 42b. The embodiment may prevent causing unevenness of the shapes of the gate electrodes 18, 23 by changing the etching rates.

According to the embodiment, the thermal oxidation process, which is necessary in the first embodiment, is unnecessary advantageously.

In the second embodiment, an etching liquid containing trimethyl-2-hydroxyethyl ammonium hydroxide is used to etch the un-doped amorphous silicon film 42b prior. In principle, any alkaline chemical solution can be used as an etching liquid, which shows a desirable etching selectivity ratio for the un-doped amorphous silicon film 42b and the boron doped amorphous silicon film 42a.

In the second embodiment, boron is implanted into the amorphous silicon film 42a. Other impurities may replace boron, on the condition that doping of such impurities causes a difference in etching rate between doped and un-doped amorphous silicon films. In addition, the silicon nitride film 38 can be replaced by a film such as a TEOS (Tetra-ethylorthosilicate) film, which is more difficult to be etched than the amorphous silicon films 42a and 42b. The first and the second protective films may be any materials which have different etching rates from each other. The first protective film and the semiconductor film to be the gate electrodes may be formed of any materials which have different etching rates from each other.

In each of the embodiments described above, the gate oxide films 17 and 22 are formed by patterning the oxide film 3 as an insulating film. Alternatively, a first and a second oxide films may be formed in different steps, and then may be patterned to form the gate oxide films 17 and 22. The gate oxide films 17 and 22 may be replaced by insulating films other than oxide films to form MIS transistors.

Other embodiments or modifications of the present invention will be apparent to those skilled in the art from consideration of the specification and practice of the invention disclosed herein. It is intended that the specification and example embodiments be considered as exemplary only, with a true scope and spirit of the invention being indicated by the following.

What is claimed is:

1. A method of manufacturing a semiconductor device including insulated-gate field-effect transistors, comprising:

forming first and second insulating films on first and second surface regions of a semiconductor substrate respectively;

forming an n-type semiconductor film on the first insulating film and forming a p-type semiconductor film on the second insulating film;

forming a first protective film on the n-type and the p-type semiconductor films;

forming a second protective film of a material on the first protective film, the material being different from that of the first protective film;

removing the second protective film partially to form first and second patterned films respectively above the first and the second surface regions;

introducing impurities into the second patterned film;

oxidizing the first patterned film and the second patterned film containing the introduced impurities to form an oxide film;

etching the oxide film selectively to slim the second patterned film thinner than the first patterned film;

etching the first protective film using the first and the second patterned films as a mask to form third and fourth patterned films, after the slimming;

etching the n-type and the p-type semiconductor films using the third and fourth patterned films as a mask to form first and second gate electrodes, respectively;

implanting n-type impurities into the first surface region using the first gate electrode as a mask and implanting p-type impurities into the second surface region using the second gate electrode as a mask, in order to form source regions and drain regions in the first and the second surface regions respectively.

2. The method of manufacturing a semiconductor device including insulated-gate field-effect transistors according to claim 1, wherein the first and the second insulating films are formed in a same step.

3. The method of manufacturing a semiconductor device including insulated-gate field-effect transistors according to claim 1, wherein the n-type impurities are implanted after the first insulating film is removed except for the portion of the first insulating film located under the first gate electrode, and the p-type impurities are implanted after the second insulating film is removed except for the portion of the second insulating film located under the second gate electrode.

4. The method of manufacturing a semiconductor device including insulated-gate field-effect transistors according to claim 1, wherein the forming of the oxide film and the etching of the oxide film are repeated plural times.

5. The method of manufacturing a semiconductor device including insulated-gate field-effect transistors according to claim 1, wherein the first protective film is a silicon nitride film, and the second protective film is an amorphous silicon film.

6. The method of manufacturing a semiconductor device including insulated-gate field-effect transistors according to claim 1, wherein the first patterned film has a size larger than that of the first gate electrode after the etching of the oxide film, while the slimmed second patterned film has a size substantially equal to that of the second gate electrode.

7. The method of manufacturing a semiconductor device including insulated-gate field-effect transistors according to claim 1, wherein the etching of the oxide film is carried out by a wet etching method.

8. The method of manufacturing a semiconductor device including insulated-gate field-effect transistors according to claim 1, wherein the etching of the n-type and the p-type semiconductor films is carried out by a reactive-ion-etching method.

9. The method of manufacturing a semiconductor device including insulated-gate field-effect transistors according to claim 1, wherein the impurities introduced into the second patterned film are phosphorus.

10. The method of manufacturing a semiconductor device including insulated-gate field-effect transistors according to claim 1, wherein n-type impurities of the n-type semiconductor film are phosphorus, the n-type impurities being introduced into at least a region of the n-type semiconductor film with the concentration of the phosphorus exceeded 1E18 $cm^{-3}$.

11. The method of manufacturing a semiconductor device including insulated-gate field-effect transistors according to claim 1, wherein the removing the second protective film partially to form the first and the second patterned films is carried out by a reactive-ion-etching method.

12. A method of manufacturing a semiconductor device including insulated-gate field-effect transistors, comprising:

forming first and second insulating films on first and second surface regions of a semiconductor substrate respectively;

forming an n-type semiconductor film on the first insulating film and forming a p-type semiconductor film on the second insulating film;

forming a first protective film on the n-type and the p-type semiconductor films;

forming a second protective film of a material on the first protective film, the material being different from that of the first protective film;

removing the second protective film partially to form first and second patterned films respectively above the first and the second surface regions;

introducing impurities into the first patterned film;

etching the first and the second patterned films isotropically to slim the second patterned film thinner than the impurity-introduced first patterned film;

etching the first protective film using the first and the second patterned films as a mask to form third and fourth patterned films, after the slimming;

etching the n-type and the p-type semiconductor films using the third and fourth patterned films as a mask to form first and second gate electrodes respectively;

implanting n-type impurities into the first surface region using the first gate electrode as a mask and implanting p-type impurities into the second surface region using the second gate electrode as a mask, in order to form source regions and drain regions in the first and the second surface regions respectively.

13. The method of manufacturing a semiconductor device including insulated-gate field-effect transistors according to claim 12, wherein the first and the second insulating films are formed in a same step.

14. The method of manufacturing a semiconductor device including insulated-gate field-effect transistors according to claim 12, wherein the n-type impurities are implanted after the first insulating film is removed except for the portion of the first insulating film located under the first gate electrode, and the p-type impurities are implanted after the second insulating film is removed except for the portion of the second insulating film located under the second gate electrode.

15. The method of manufacturing a semiconductor device including insulated-gate field-effect transistors according to claim 12, wherein the first protective film is a silicon nitride film, and the second protective film is an amorphous silicon film.

16. The method of manufacturing a semiconductor device including insulated-gate field-effect transistors according to claim 12, wherein the first patterned film has a size larger than that of the first gate electrode after the isotropical etching, while the slimmed second patterned film has a size substantially equal to that of the second gate electrode.

17. The method of manufacturing a semiconductor device including insulated-gate field-effect transistors according to claim 12, wherein the isotropical etching of the first and the second patterned films is carried out by a wet etching method using alkaline chemical solution.

18. The method of manufacturing a semiconductor device including insulated-gate field-effect transistors according to claim 12, wherein the etching of the n-type and the p-type semiconductor films is carried out by a reactive-ion-etching method.

19. The method of manufacturing a semiconductor device including insulated-gate field-effect transistors according to claim 12, wherein the impurities introduced into the first patterned film are boron.

20. The method of manufacturing a semiconductor device including insulated-gate field-effect transistors according to claim 12, wherein the removing of the second protective film partially to form the first and the second patterned films is carried out by a reactive-ion-etching method.

* * * * *